US011367640B2

(12) United States Patent
Moffat et al.

(10) Patent No.: US 11,367,640 B2
(45) Date of Patent: Jun. 21, 2022

(54) COMBINATION VACUUM AND OVER-PRESSURE PROCESS CHAMBER AND METHODS RELATED THERETO

(71) Applicant: Yield Engineering Systems, Inc., Livermore, CA (US)

(72) Inventors: William Moffat, San Jose, CA (US); Craig Walter McCoy, San Jose, CA (US)

(73) Assignee: Yield Engineering Systems, Inc., Livermore, CA (US)

( * ) Notice: Subject to any disclaimer, the term of this patent is extended or adjusted under 35 U.S.C. 154(b) by 0 days.

(21) Appl. No.: 16/663,319

(22) Filed: Oct. 24, 2019

(65) Prior Publication Data
US 2020/0234986 A1  Jul. 23, 2020

Related U.S. Application Data

(63) Continuation of application No. 15/919,169, filed on Mar. 12, 2018, now Pat. No. 10,490,431.

(60) Provisional application No. 62/469,522, filed on Mar. 10, 2017.

(51) Int. Cl.
| | |
|---|---|
| *F27D 1/18* | (2006.01) |
| *H01L 21/67* | (2006.01) |
| *H01L 21/673* | (2006.01) |
| *F27D 5/00* | (2006.01) |
| *H01L 21/02* | (2006.01) |
| *H01L 21/677* | (2006.01) |
| *F27D 7/06* | (2006.01) |

(52) U.S. Cl.
CPC ...... *H01L 21/67376* (2013.01); *F27D 1/1866* (2013.01); *F27D 5/0037* (2013.01); *H01L 21/02046* (2013.01); *H01L 21/6719* (2013.01); *H01L 21/67034* (2013.01); *H01L 21/67126* (2013.01); *H01L 21/67757* (2013.01); *F27D 2007/063* (2013.01)

(58) Field of Classification Search
CPC ........... H01L 21/6719; H01L 21/67207; H01L 51/001; H01L 21/67778; H01L 21/67781; H01L 21/67126; H01L 21/67376; H01L 21/67757; F27D 7/06; F27D 1/18; F27D 1/1808; F27B 5/04; F27B 17/0033
See application file for complete search history.

(56) References Cited

U.S. PATENT DOCUMENTS

| | | | | |
|---|---|---|---|---|
| 5,207,573 | A * | 5/1993 | Miyagi | C21D 1/34 432/182 |
| 5,320,680 | A * | 6/1994 | Learn | C23C 16/452 118/724 |
| 5,421,892 | A * | 6/1995 | Miyagi | C23C 16/46 118/724 |
| 5,480,300 | A * | 1/1996 | Okoshi | C30B 31/10 432/152 |

(Continued)

*Primary Examiner* — Gregory A Wilson
(74) *Attorney, Agent, or Firm* — Michael A. Guth

(57) ABSTRACT

A process chamber system adapted for both vacuum process steps and steps at pressures higher than atmospheric pressure. The chamber door may utilize a double door seal which allows for high vacuum in the gap between the seals such that the sealing force provided by the high vacuum in the seal gap is higher than the opposing forces due to the pressure inside the chamber and the weight of the components.

7 Claims, 5 Drawing Sheets

(56) References Cited

U.S. PATENT DOCUMENTS

| | | | | |
|---|---|---|---|---|
| 5,813,851 A | * | 9/1998 | Nakao | C23C 16/46 |
| | | | | 432/6 |
| 5,902,103 A | * | 5/1999 | Maeda | C23C 16/455 |
| | | | | 432/253 |
| 5,908,292 A | * | 6/1999 | Smith | C30B 31/12 |
| | | | | 34/78 |
| 6,390,145 B1 | * | 5/2002 | Okabe | H01L 21/67373 |
| | | | | 141/1 |
| 8,851,886 B2 | * | 10/2014 | Morita | H01L 21/67098 |
| | | | | 432/242 |
| 2005/0118000 A1 | * | 6/2005 | Kasai | H01L 21/67126 |
| | | | | 414/217 |
| 2011/0222038 A1 | * | 9/2011 | Yamashita | H01L 21/67126 |
| | | | | 355/53 |

* cited by examiner

COMBINATION VACUUM AND OVER-PRESSURE PROCESS CHAMBER AND METHODS RELATED THERETO

CROSS-REFERENCE TO RELATED APPLICATIONS

This application is a continuation of U.S. patent application Ser. No. 15/919,169 to Moffat et al., filed Mar. 12, 2018 which claims priority to U.S. Provisional Patent Application No. 62/469,522 to Moffat et al., filed Mar. 10, 2017, which are hereby incorporated by reference in their entirety.

FIELD OF THE INVENTION

This invention relates to process chambers, namely a process chamber adapted for both vacuum and pressure processes.

BACKGROUND

What is called for is a process chamber system that allows for both vacuum processing and processing in pressures greater that atmospheric pressure in the same chamber.

SUMMARY

A process chamber system adapted for both vacuum process steps and steps at pressures higher than atmospheric pressure. The chamber door may utilize a double door seal which allows for high vacuum in the gap between the seals such that the sealing force provided by the high vacuum in the seal gap is higher than the opposing forces due to the pressure inside the chamber and the weight of the components.

DETAILED DESCRIPTION

Figure 1:
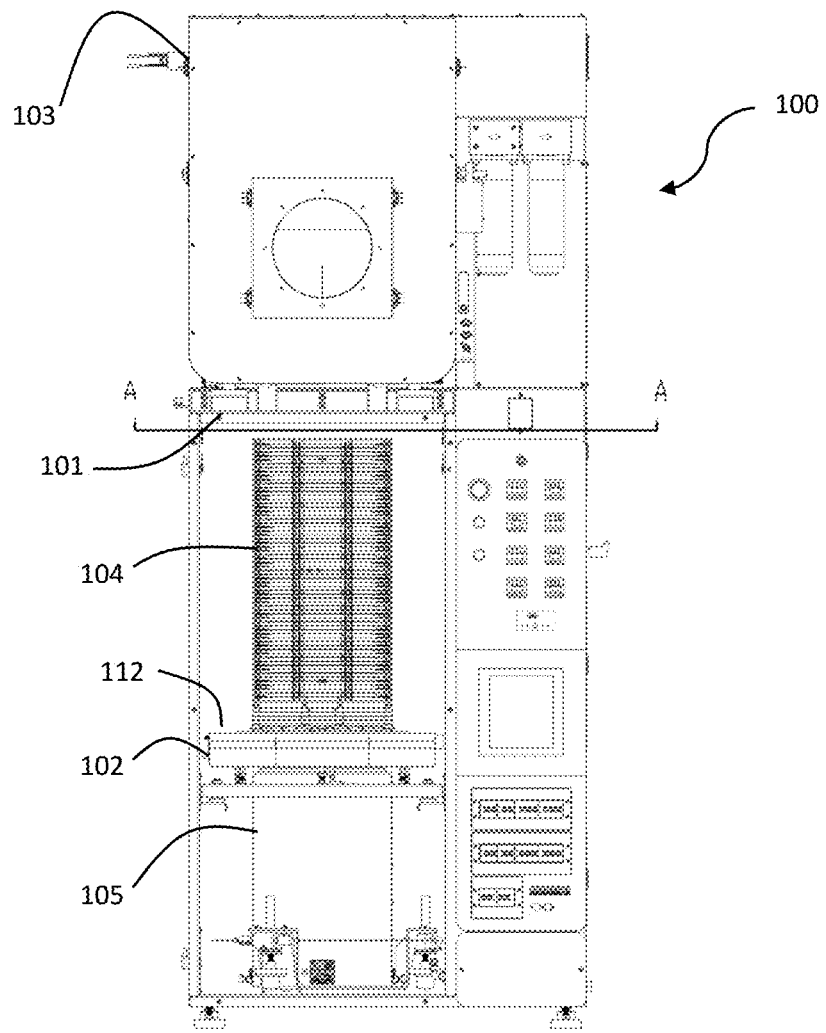
FIG. 1 is a partial cutaway view of a process chamber system according to some embodiments of the present invention.

In some embodiments of the present invention, as seen in FIG. 1, a combination process chamber system 100 is seen with its chamber 103 and chamber opening flange 101. The chamber has its opening facing downward and is adapted to receive wafers 104 from below. The chamber door 102 is raised from underneath with a door lift mechanism 105, which may be a hydraulic mechanism. The wafers may lay horizontally and be stacked vertically in a cart or other stacking holder. The top surface 112 of the chamber door 102 may have grooves for an inner O-ring and an outer O-ring with a mating outline for these grooves seen on the bottom mating surface of the chamber opening flange 101.

Figure 2:
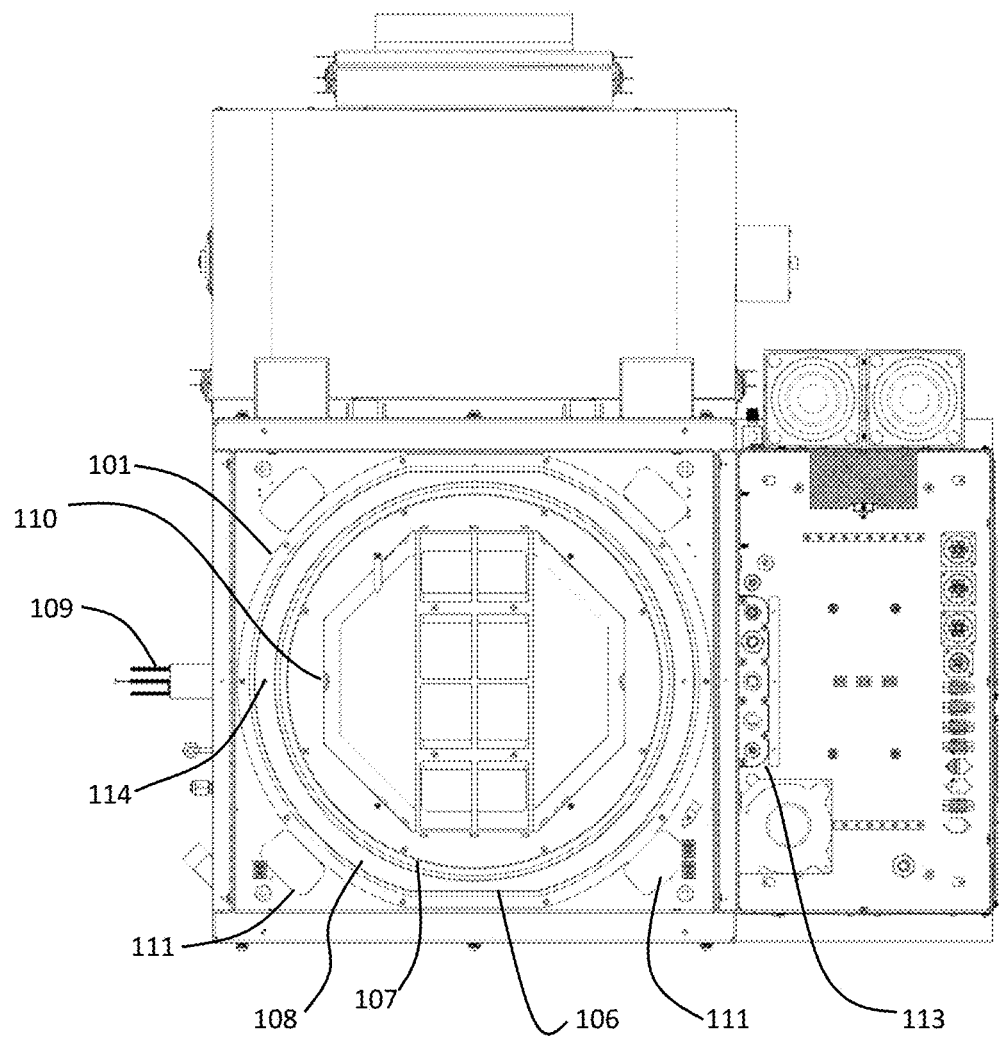
FIG. 2 is a bottom view through a cut line of a process chamber system according to some embodiments of the present invention.
Figure 3:
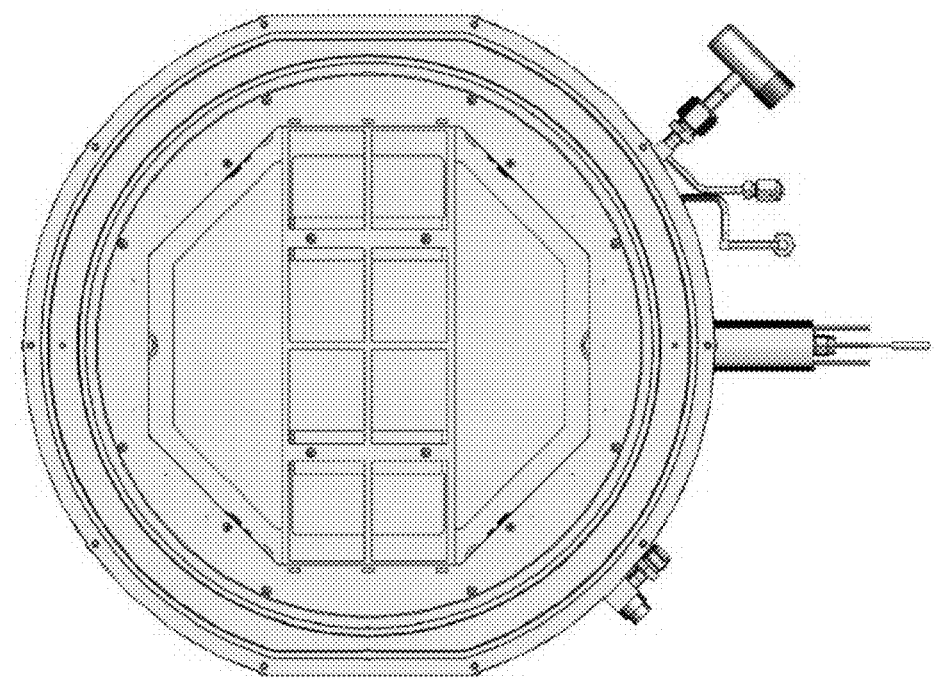
FIG. 3 is a bottom view of a process chamber according to some embodiments of the present invention.

FIG. 2 illustrates the view looking upward into the chamber 103 from below. The bottom of the chamber 103 is rimmed with a flange 101 adapted to mate with a top surface 112 of the chamber door 102. The flange 101 has grooves for an inner O-ring and an outer O-ring with a mating outline for these grooves seen on the top mating surface of the chamber door 102. In some aspects, both O-ring grooves may be circular. In some aspects, the O-ring grooves may be partially circular and may conform to other features of the surfaces upon which they reside. In some aspects, the O-ring grooves may be of another shape. The flange 101 has an inner seal O-ring 107 and an outer seal O-ring 106. A seal gap 108 occurs between the inner seal 107 and the outer seal 106. A high vacuum source 109 is coupled to the seal gap 108 via a high vacuum port 114.

The chamber is adapted to run at low pressures as well as pressure higher than one atmosphere. A low vacuum port 110 is adapted to evacuate the chamber. Also, a gas manifold 113 is adapted to provide gasses to the chamber, including high purity dry inert gas. In some aspects, the chamber runs a low pressure process, such as drying a polyimide precursor, for example. As discussed further below, the pressure during such a process may be in the range of 1-15 Torr. As also discussed further below, in some processes low vacuum is alternated with high purity inert gas to drive oxygen levels very, very, low. The gas manifold 113 may provide gas through one or more gas ports into the chamber for such a process. In a low vacuum process, the door 102 may be raised up to the chamber 103 using the door mechanism 105. The chamber sealing is done by the pull of the vacuum in the chamber across the area of the door, pulling the door onto the O ring seals, providing the seal.

In some processes, it may be desired to also include an overpressure step, for example, in the range of 1.1 to 1.2 atmospheres, including up to 910 Torr. This same process chamber system 100 may be used for overpressure steps without having to transfer the treated substrates to a different chamber, and also without having to expose the substrates to oxygen, especially in the case where oxygen levels have been purposefully very low. Keeping the substrates in the same, sealed, chamber when alternating from vacuum to overpressure processes may allow for the maintenance of an atmosphere that has had a target gas, such as oxygen, at very low levels. In contrast to purging a chamber, such as with nitrogen, in order to remove oxygen, the use of vacuum pulls may reduce the oxygen level to a parts per million range, as described below. Further, the use of vacuum pulls alternated with pure dehydrated inert gas, as described below, may significantly reduce the oxygen level to a lower level than other known processes may achieve, and then allow utilization of this low oxygen condition in an overpressure process step.

In some aspects, the door mechanism 105 provides vertical lift to the chamber door 102 in order to allow the top surface 102 of the chamber door 102 to mate to the bottom surface of the chamber opening flange 101 of the chamber 103. As described above, this mating of the chamber door to the chamber opening flange may be the compression of an inner O-ring and an outer O-ring. In some aspects, the sealing force provided by the door mechanism 105 is added to the sealing force provided by evacuating the seal gap 108 to determine the total sealing force available. The chamber pressure on the door provides a counter force, as do the weight of the door and the cart components, as well as the O-ring seal compression spring force. In some aspects, the sealing force provided by the door mechanism and the evacuated seal gap area are gauged to provide enough sealing force to keep the chamber door sealed during an overpressure process in the process chamber without any other sealing clamp or fastening mechanisms. In the case of a process chamber isolated from direct user contact and instead confined to an area wherein wafers are moved in and out of the process chamber using robots, having a process chamber which can withstand an overpressure process step without external latching allows for such a use.

In an exemplary process according to some embodiments of the present invention, a polyimide precursor is applied to a silicon substrate. In some aspects, the polyimide precursor is applied directly over the silicon substrate. In some aspects, the polyimide precursor is applied over other layers already on a substrate, which may be other polyimide layers and metal layers, for example. In some aspects, the solvent used in the polyimide precursor is NMP. An expected thickness for semiconductor applications is in the range of 7-10 microns. Although a single substrate could be processed, in some aspects a plurality of substrates may be processed. As seen, a process oven may be used to support a plurality of substrates within a chamber. The process oven may include internal heaters, heated inert gas inputs, and vacuum capability. The substrates are placed into the chamber that has been heated to 150 C. In some aspects, the chamber is heated to a temperature in the range of 135 C to 180 C. The chamber pressure is reduced to a first drying pressure of 50 Torr. In some embodiments, the first drying pressure is in the range of 30-60 Torr. After reaching the first drying pressure, the chamber may then be flushed with a heated inert gas such as nitrogen at a pressure of 600 Torr. In some aspects the heated inert gas may be at a pressure in the range of 550 to 760 Torr. The nitrogen may be heated to the same temperature as the chamber, 150 C. The chamber pressure is then reduced to a second drying pressure of 25 Torr. In some embodiments, the second drying pressure is in the range of 15-30 Torr. After reaching the second drying pressure, the chamber may then be flushed with a heated inert gas such as nitrogen at a pressure of 600 Torr. In some aspects the heated inert gas may be at a pressure in the range of 550 to 760 Torr. The nitrogen may be heated to the same temperature as the chamber, 150 C. The chamber pressure is then reduced to a third drying temperature of 1 Torr. In some embodiments, the third drying pressure is in the range of 1-15 Torr. After reaching the third drying pressure, the chamber may then be filled with heated inert gas, such as nitrogen, up to 650 Torr, in preparation for imidization of the polyimide precursor. The substrates may then undergo temperature imidization in the same chamber. As described further below, the oxygen level in the process oven may now be very extremely low. The subsequent temperature imidization may occur at 350-375 C, and as further described below.

In an exemplary embodiment further illustrating the timing of a process as described above, a process may begin with the heating of the process oven to a temperature of 150 C. A single substrate or a plurality of substrates within the process oven, which include a polyimide precursor including a solvent such as NMP, are put into the process oven which has been preheated to the temperature of 150 C. The process oven pressure is then reduced to a first drying pressure of 50 Torr. This portion of the process may take 2-3 minutes. The process oven is then flushed with preheated nitrogen heated to 150 C up to a pressure of 600 Torr. This portion of the process may take 2-3 minutes. The process oven pressure is then reduced to a second drying pressure of 25 Torr. This portion of the process may take 3-4 minutes. The process oven is then flushed with preheated nitrogen heated to 150 C up to a pressure of 600 Torr. This portion of the process may take 2-3 minutes. The process oven pressure is then reduced to a third drying pressure of 1 Torr. This portion of the process may take 4-5 minutes. The process oven is then flushed with preheated nitrogen heated to 150 C up to a pressure of 650 Torr. This portion of the process may take 2-3 minutes. The aforementioned steps have now greatly reduced the oxygen level in the process oven, as well as having removed all or nearly all of the solvent from the polyimide precursor with little or no bubbling or skinning of the polyimide precursor.

The oxygen level in the process oven may now be down as low as approximately 1 ppm, as an end result of the drying process. The vacuum pulsing as described above, in conjunction with the intervening flushing with nitrogen, provides a benefit for a subsequent imidization process, which is already separately enhanced by the significantly enhanced drying. The vacuum pulsing and intervening flushing results in a much lower oxygen level in the process chamber as the substrates go further in the process. In contrast to prior methods which pull vacuum once for a combined drying/imidization process, the vacuum pulsing reduces the partial pressure of oxygen significantly, as each flushing with nitrogen resets the initial gas balance prior to the next pull of vacuum. The inflows of heated inert gas enhance the heating of the polyimide precursor layer, as well as the fixturing within the chamber and the chamber itself. The reduced pressure of the process described herein enhances, and speeds up, the evaporation of the solvent, and also allows for a temperature to be used for the evaporation that is below the skinning temperature of the polyimide precursor. The staging of the reduced pressure at sequentially lower pressures reduces bubbling which might occur by simply going straight to a much reduced pressure, and avoids the residual solvent which would remain if the very reduced pressure is not utilized. Residual solvent may inhibit the imidization of the polyimide precursor. The pulsing and flushing then further adds the benefit of a final chamber composition with significantly less oxygen than prior methods, reducing or eliminating the browning which may occur in the polyimide layer during temperature imidization in the presence of oxygen.

With the tiered vacuum application, in conjunction with nitrogen flushing, oxygen levels may be driven very, very low. With the above-described process, the starting concentration of oxygen at the initial atmospheric conditions is approximately 230,000 parts per million (ppm). When the initial vacuum is applied down to 50 Torr, and then the chamber is refilled with nitrogen, the concentration of oxygen will have been reduced to approximately 15,131 ppm. With the subsequent vacuum pull down to 25 Torr, and then refilling with nitrogen, the concentration of oxygen will have been reduced to approximately 498 ppm. With the final vacuum pull down to 1 Torr, and subsequent refilling with nitrogen, the resulting concentration of oxygen will be down to 0.65 ppm. The very, very, low oxygen concentrations that result allow for a subsequent processing, including temperature imidization, at oxygen concentrations well below any prior process. In actual practice, the purity of the nitrogen supply may become the active parameter in how low of an oxygen concentration can be reached. If the nitrogen supply is known to have 10 ppm oxygen, for example, then that will limit the depth of oxygen removal. Some processing chambers may have nitrogen availability with down to 1 ppm O2, and with such a system oxygen concentration can be driven down to approximately 1 ppm. Simple flushing of a chamber with pure nitrogen provides some reduction in oxygen concentration, but such processes are very time consuming and do not achieve results at all comparable to the above-described process.

Further, the use of heated nitrogen for the re-filling steps in the above-described process works to minimize the effects of freezing than may have happened during the vacuum pull. As water boils at 72 C at 50 Torr, 26 C at 25 Torr, and −21 C at 1 Torr, the heated nitrogen input thus facilitated evaporation of any water than may be found in the devices being dried or outgassed.

In some aspects, a process that began using steps utilizing low vacuum may also then want to include a step that is at a pressure greater than atmospheric pressure. The step using pressure greater than atmospheric pressure may include heating of the substrates. For this step, the high vacuum port coupled to the seal gap is driven to near absolute vacuum. The force due to the overpressure situation in the chamber, which is the pressure times the area within the inner seal, must be overcome by the hard vacuum in the seal gap as applied across the area within the seal gap.

A discussion of the forces involved is seen here:
Applied Load Factors $$\sum_1^N E = F \text{ Chamber Pressure} +$$

$F$ Door Cart Components Weight + $F$ Static Seal Compression −

$F$ Door Cart Lift Capacity <= $F$ Vacuum Hold Capacity

The chamber sealing force must overcome the weight of the door and the components on the cart which is raised with the door. Also, the chamber sealing force must overcome the force due to the chamber pressure exerting downward across the horizontal area out to the inner O-ring. The chamber sealing force must also overcome the force generated by the compression of the O-ring seals (the static sealing compression). The components contributing to the chamber sealing force are the door lift mechanism force, and the vacuum hold force of the vacuum across the area between the O-rings.

The static seal compression depends upon a variety of factors. The Shore A Hardness of the O-ring seals, the diameter of the O-rings, and the total length of the two O-rings are among the factors. A softer O-ring can seal at a lower pressure, and an O-ring with a larger diameter may offer a better seal in the case of imperfections in the flanges, including some lack of flatness. However, most if not all O-rings over 0.250 inches in diameter are spliced, and this may lead to other problems. In an exemplary embodiment, the O-rings are 0.250 inches in diameter and of a 50 durometer Shore A Hardness.

Figure 4:
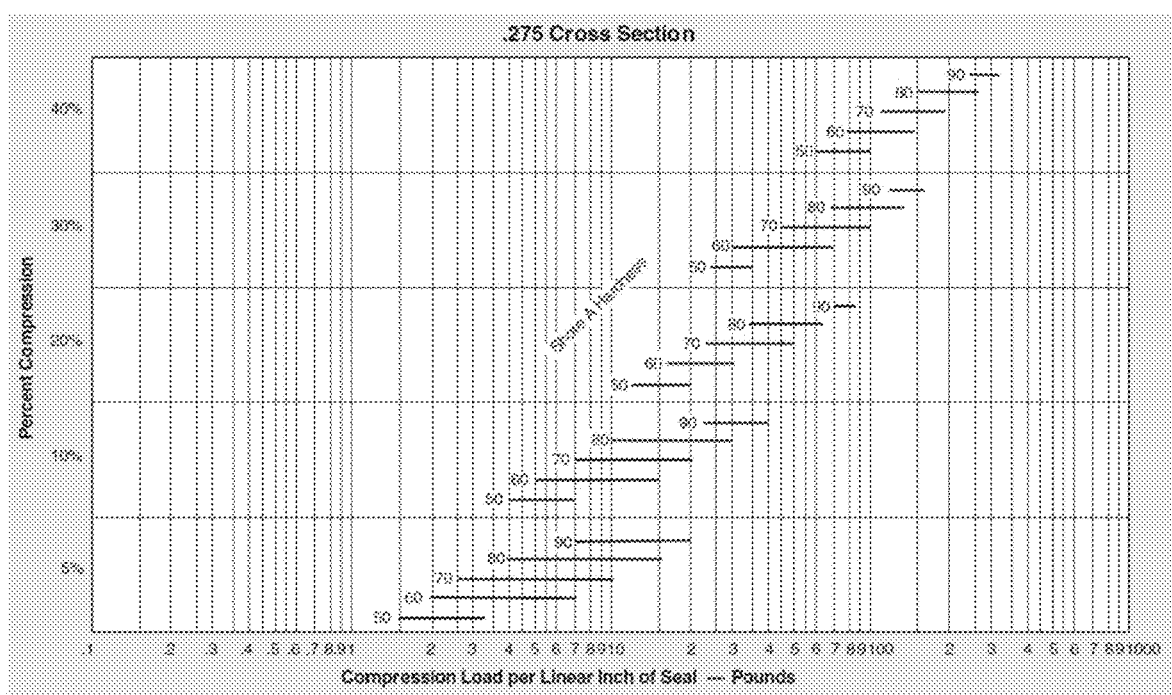
FIG. 4 is a static seal compression chart.

A static seal compression chart for basic O-ring elastomers is seen in FIG. 4.

The above chart shows great variance of what the true static seal load requirements should be.

$$\% \text{ Compression} = \frac{.043}{.275} = 15.5\%$$

We will use 15% for calculation. Since 15% is in between data for 10% and 20%, we will use the mean value for both 50 durometer data sets and average the results.

Using exemplary inner and outer diameters as 19.75 and 21.25 inches, respectively, as a starting point, we see:

Mean Averaged Compression Load=10 lbs/in $F$ Static Seal Compression=Mean Averaged Compression Load×Seal Circumference Total $C$total=$Ci+Co$=π($di+do$)

Figure 5:
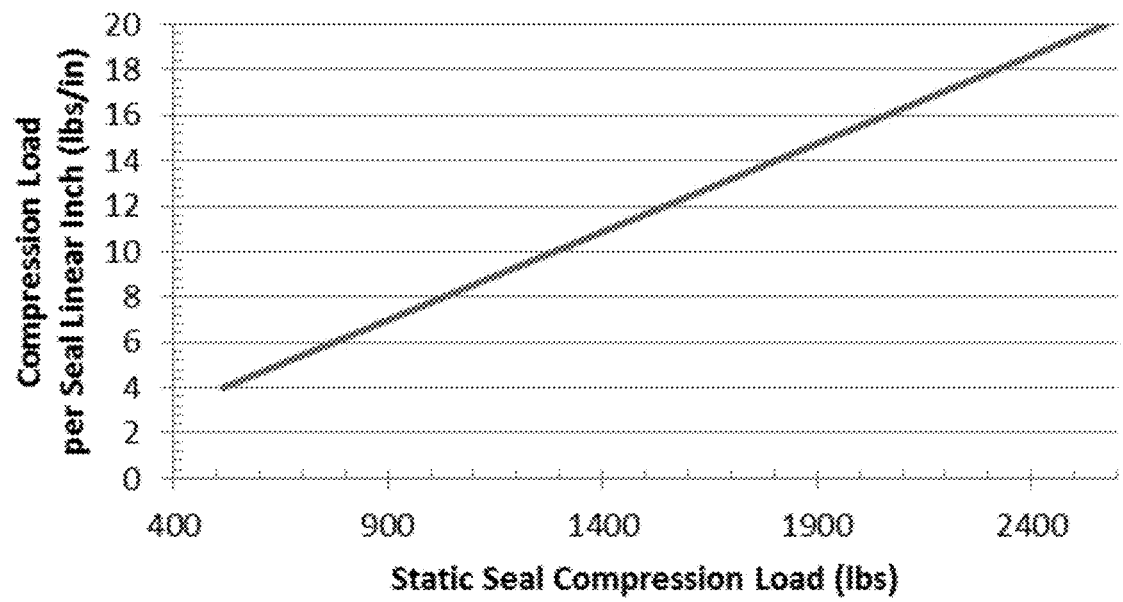
FIG. 5 is a chart showing the static seal compression vs. the compression load per seal linear inch.

$do$=21.25 in $di$=19.75 in $C$total=π(19.75+21.25)=128.8 in $F$Static Seal Compression=10×128.8=+1288 lbs The chart in FIG. 5 shows the static seal compresCsion vs compression load per seal linear inch, throughout the entire chart range.

In an exemplary embodiment, a cart lift system has two pneumatic lifting cylinders capable of 145 psig, with 40 mm cylinder diameters.

$$F \text{ Cart Lift Capacity} = 2PA = \frac{(2)145\pi d^2}{4}$$

$$d = 40/(25.4) = 1.575 \text{ in}$$

$$F \text{ Cart Lift Capacity} = -565 \text{ lbs}$$

Using the calculation from page one, the required vacuum lift capacity can be determined.

$$\sum_1^N E = F \text{ Chamber Pressure} + F \text{ Door Cart Components Weight} +$$

$F$ Static Seal Compression − $F$ Door Cart Lift Capacity <=

$F$ Vacuum Hold Capacity

354 + 358 + 1288 − 565 ≤ $F$ Vacuum Hold Capacity 1435 lbs ≤ $F$ Vacuum Hold Capacity As seen, the seal compression loads tend to dominate this calculation.

The gap area between the seals is designed to be sufficiently large to provide the force needed to seal, in concert with the above analysis.

For example, a 19.9 inch diameter inner seal and an outer seal in the range of 25.0 inch outer seal may provide the force needed to seal with the above process parameters.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A method for processing in a process chamber, said method comprising the steps of:
   loading substrates into a process chamber through a downward facing chamber door opening, said chamber comprising a chamber door opening flange around said chamber door opening and a chamber door;
   closing the chamber door by raising the chamber door from underneath the process chamber door opening, wherein said chamber door comprises:
   a sealing surface adapted to seal to said chamber door opening flange;
   an inner groove on said sealing surface;

an inner O-ring residing in said inner groove;
an outer groove on said sealing surface; and
an outer O-ring residing in said outer groove;
creating a door seal between the chamber door sealing surface and the chamber door opening flange by pulling a vacuum between two seals which create said door seal using a high vacuum source;
running a first process step in the process chamber while said process chamber is under vacuum; and
running a second process step in the process chamber at a pressure greater than atmospheric pressure.

2. The method of claim 1 wherein said first process step comprises a heating step.

3. The method of claim 1 wherein said method is a method for temperature imidization of a polyimide precursor.

4. The method of claim 1 wherein said second process step comprises a heating step.

5. The method of claim 1 wherein the step of lifting the door up comprises lifting the door up with a door lift mechanism with a known maximum lift capacity.

6. The method of claim 5 wherein said chamber door and said chamber are not held closed with a mechanical latch or fasteners other than the door lift mechanism and the force of vacuum between the two seals which create the door seal.

7. A method for processing in a process chamber, said method comprising the steps of:
loading substrates into a process chamber through a downward facing chamber door opening, said chamber comprising a chamber door opening flange around said chamber door opening and a chamber door;
closing the chamber door by raising the chamber door from underneath the process chamber door opening, wherein said chamber door comprises:
a sealing surface adapted to seal to said chamber door opening flange;
an inner groove on said sealing surface;
an inner O-ring residing in said inner groove;
an outer groove on said sealing surface; and
an outer O-ring residing in said outer groove;
creating a door seal between the chamber door sealing surface and the chamber door opening flange by pulling a vacuum between two seals which create said door seal using a high vacuum source,
wherein said method is a method for temperature imidization of a polyimide precursor.

* * * * *